(12) United States Patent
Stutzman

(10) Patent No.: US 7,030,638 B2
(45) Date of Patent: Apr. 18, 2006

(54) METHOD AND DEVICE WITH VARIABLE RESILIENCE SPRINGS FOR TESTING INTEGRATED CIRCUIT PACKAGES

(75) Inventor: Jay Stutzman, Phoenix, AZ (US)

(73) Assignee: Wells-CTI, LLC, Vancouver, WA (US)

( * ) Notice: Subject to any disclaimer, the term of this patent is extended or adjusted under 35 U.S.C. 154(b) by 0 days.

(21) Appl. No.: 10/627,953

(22) Filed: Jul. 24, 2003

(65) Prior Publication Data

US 2005/0017742 A1    Jan. 27, 2005

(51) Int. Cl.
*G01R 31/26* (2006.01)
*H05K 1/00* (2006.01)

(52) U.S. Cl. .......................................... 324/765; 439/73
(58) Field of Classification Search ................ 324/765, 324/754, 755, 757, 758; 439/68–73, 331
See application file for complete search history.

(56) References Cited

U.S. PATENT DOCUMENTS 5,882,221 A * 3/1999 Nguyen et al. ............. 439/331
6,025,732 A * 2/2000 Foo et al. ................... 324/760
6,086,387 A * 7/2000 Gallagher et al. ............ 439/71
6,304,073 B1 * 10/2001 Saito ........................ 324/158.1

OTHER PUBLICATIONS

Wells-CTI, Phoenix, Arizona, Assembly Drawing, Model No. 693, Part No. 693-1425AB0436A1-0, Dec. 4, 2001.
Wells-CTI, Phoenix, Arizona, Assembly Drawing, Model No. 692, Part No. 692-0575-16, Jun. 1, 2001.
Wells-CTI, Phoenix, Arizona, Assembly Drawing, Model No. 654, Part No. 654048629010808, Apr. 22, 1997.

* cited by examiner

*Primary Examiner*—Vinh Nguyen
*Assistant Examiner*—Russell M. Kobert
(74) *Attorney, Agent, or Firm*—Marger, Johnson & McCollom, PC

(57) ABSTRACT

An integrated circuit (IC) package testing device using a selectable number of leaf springs to provide a resilient and consistent normal force to the IC package and the method of operating the device. The leaf springs are shaped to provide the proper compliance and resilient force and are shaped to fit side-by-side within the lid of the device. The springs can be easily changed for differently sized IC packages.

26 Claims, 11 Drawing Sheets

(20 SPRINGS)

(10 SPRINGS)

(4 SPRINGS)

METHOD AND DEVICE WITH VARIABLE RESILIENCE SPRINGS FOR TESTING INTEGRATED CIRCUIT PACKAGES

FIELD OF THE INVENTION

This invention relates to integrated circuit testing sockets and more particularly to burn-in testing sockets.

BACKGROUND OF THE INVENTION

Integrated circuit (IC) packages must be tested after their manufacture, normally at elevated temperatures, which is the burn-in process. The integrated circuits are temporarily installed on a circuit board, tested, and then removed from the circuit board and shipped. Accordingly, test sockets are necessary to install the IC packages on the printed circuit board for testing. These test sockets include multiple contacts to connect each of the terminals of the IC package to corresponding conductors on the printed circuit board. Since the test sockets are used repeatedly in high volume IC package manufacture, it is desirable that the sockets be durable and capable of reliable, repeated operation.

The test sockets are positioned on a burn-in board where the sockets are arranged in a relatively dense array to allow for as many IC packages as possible to be tested at once. These sockets are therefore arranged in a relatively close side-by-side and end-to-end spacing.

It is desirable that the test sockets be capable of conforming to a large tolerance of package thicknesses. IC packages are manufactured with a metal "heat spreader" attached to the back of the package to help more evenly distribute the heat generated by the silicon die that is generally in or on the back of the substrate. A tolerance stack-up builds up because of the thickness tolerances of the IC package, the adhesive joint between the substrate and the "heat spreader," and the "heat spreader" itself. For example, an IC package can end up with an overall thickness tolerance of + or –0.013 inches.

One of the test socket types that performs the burn-in function includes a base portion and a lid which rotates about one side by way of a hinge, and a latch which holds the lid and base together, where the latch is opposite the hinge. Unless the tolerance of package thickness is accounted for in the design and manufacture of this type of socket, there can be a great disparity in contact pressure between the contacts of the socket and the contact sections of the package. Some prior art examples of this type of test socket are Wells-CTI socket numbers 654, 692 and 693 shown in FIGS. 1–3, respectively.

The prior art Wells-CTI 654 socket 20, shown in FIGS. 1A and 1B, accommodates an IC with length and width dimensions of 8 mm×8 mm. The 654 socket 20 accounts for thickness tolerances by allowing its pressure pad 30 to rock around a center pivot pin 22 mounted parallel to the hinge 24 and by providing compliance via coil springs 26 mounted in its lid 28 on either side of the center pivot pin 22 applying balanced force to the back of the pressure pad 30 and by a coil spring 32 positioned beneath the IC receiver pocket 34.

The prior art Wells-CTI 692 socket 36, shown in FIGS. 2A and 2B, accommodates IC packages with dimensions of approximately 31 mm×31 mm. The 692 socket 36 also accounts for thickness tolerances by allowing its pressure pad 38 to rock around a center pivot pin 40 mounted parallel to the hinge 42. The 692 socket 36 provides compliance by means of coil springs 44 positioned within the corner posts 46 with the lid 48 and latch 50 connected to those corner posts by bars 52 positioned parallel to the hinge 42. The force of the coil springs 44 may be slightly adjusted by adjusting the threaded engagement 54 of the corner posts 46. The adjustment is limited by the properties of the individual coil springs 44 and any wider adjustment would require a complete disassembly of the socket and replacement of the springs.

The prior art Wells-CTI 693 socket 56, shown in FIGS. 3A and 3B, accommodates even larger IC packages 58 with dimensions of up to 42.5 mm× 42.5 mm. The 693 socket 56 applies evenly distributed pressure to an IC package 58 via side pads 60 that are linked through symmetrically mechanical rockers 62 to torsional coil springs 64 positioned on the hinge 66 and latch 68 ends of the lid 70. The compliance force of the torsional coil springs 64 can only be adjusted by replacing the torsional coil springs 64, and that requires disassembly of the lid 70.

Therefore, it would be advantageous to have a test socket that accommodates IC packages with a wide range of thickness tolerances by allowing for flexible and more easily adjustable compliance.

The foregoing and other objects, features and advantages of the invention will become more readily apparent from the following detailed description of a preferred embodiment of the invention which proceeds with reference to the accompanying drawings.

DETAILED DESCRIPTION

Figure 1A:
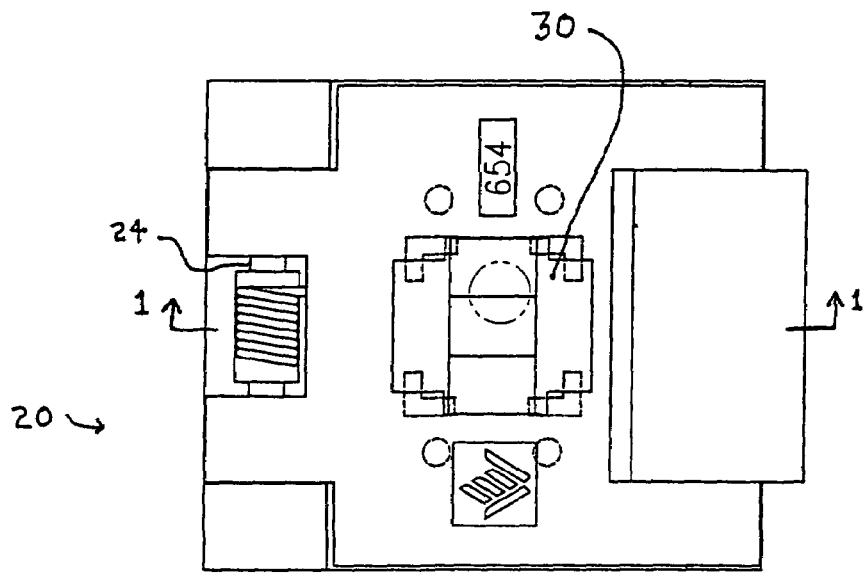
FIG. 1A is a top view of a prior art IC socket testing device shown in a closed and latched position.
Figure 1B:
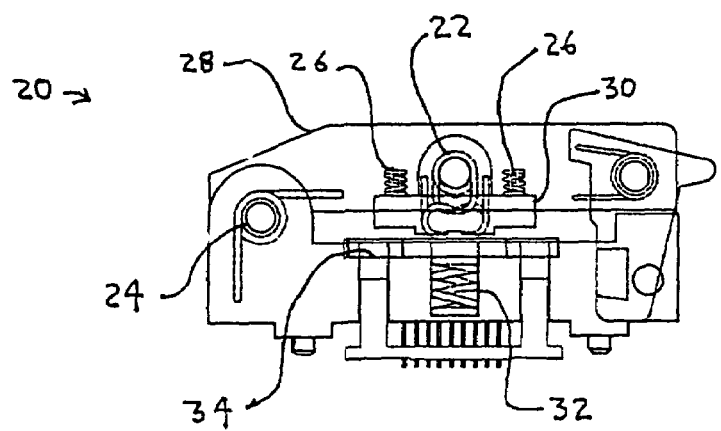
FIG. 1B is a cross-sectional view taken of the prior art IC socket testing device of FIG. 1A taken along line 1—1.
Figure 2A:
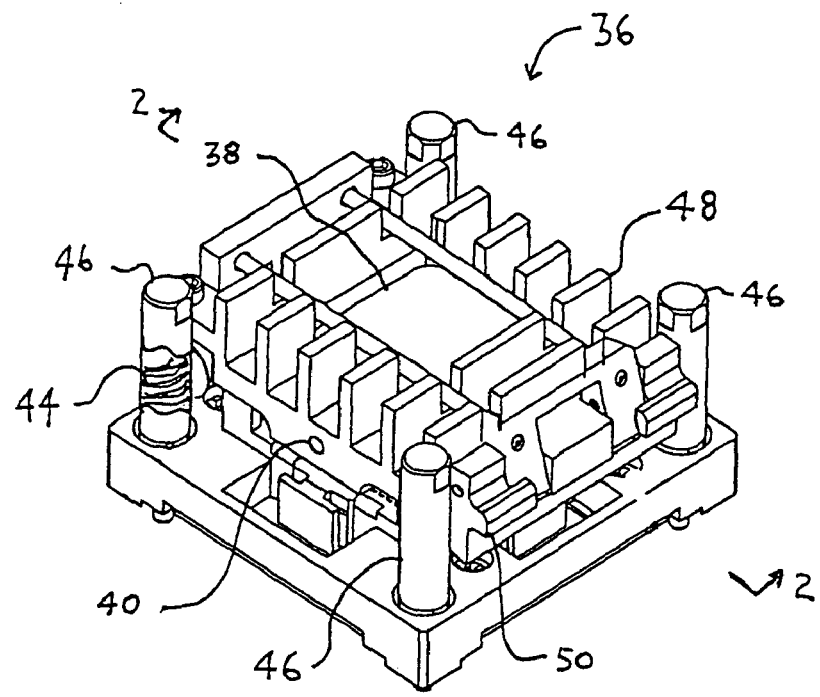
FIG. 2A is a perspective view of another prior art IC socket testing device shown in a closed and latched position.
Figure 2B:
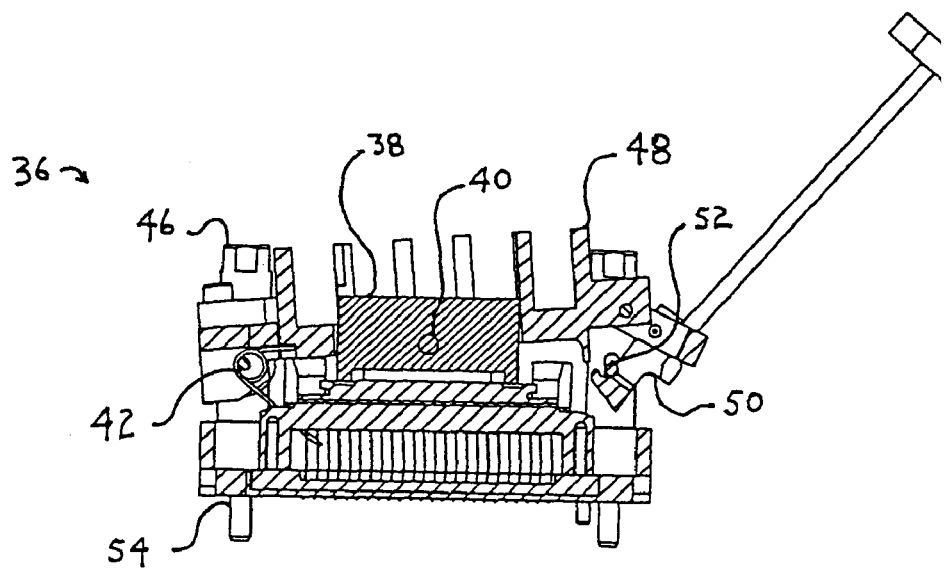
FIG. 2B is a cross-sectional view of the prior art IC socket testing device of FIG. 2A taken along line 2—2 and shown in an open position.
Figure 3A:
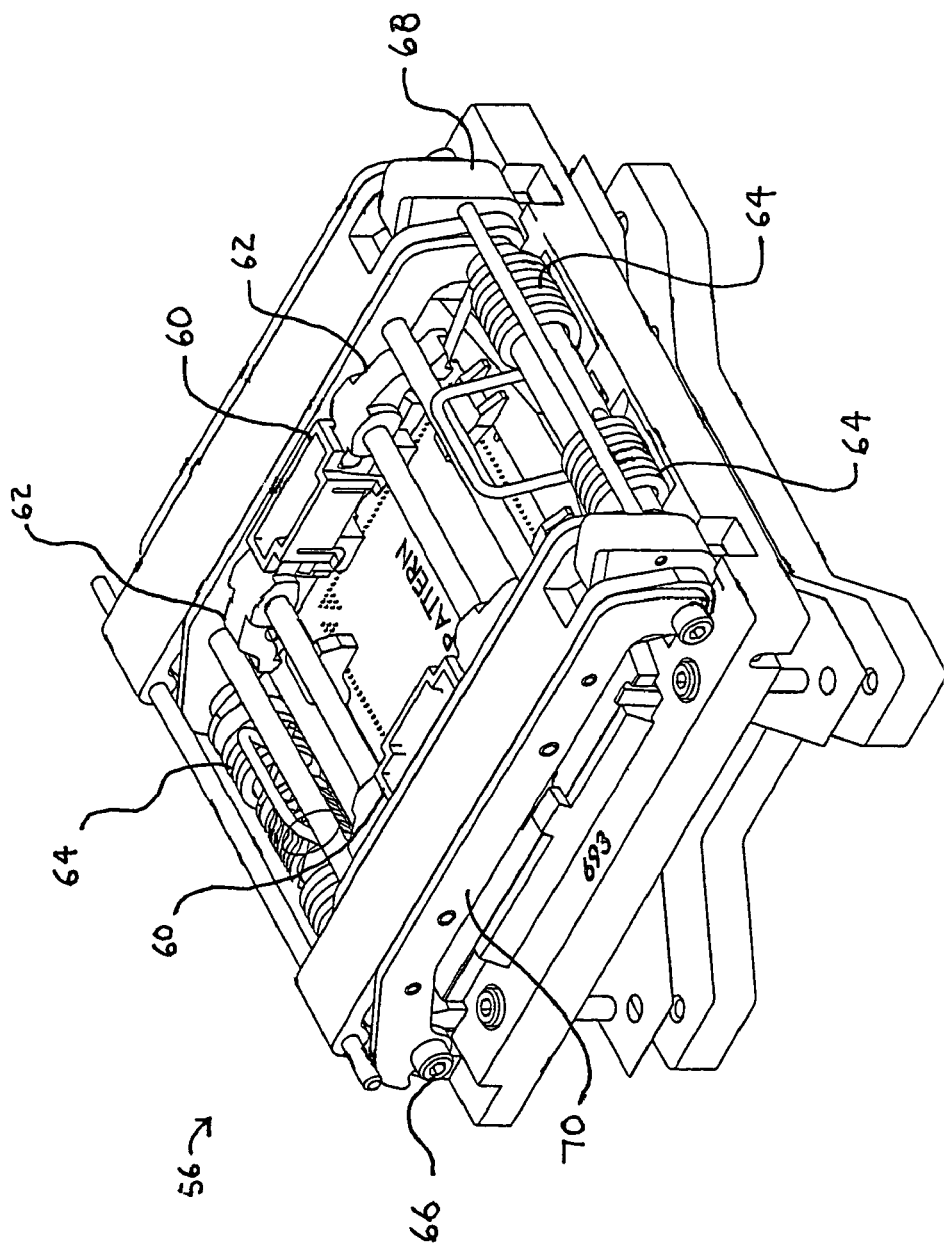
FIG. 3A is a perspective view of another prior art IC socket testing device shown in a closed and latched position.
Figure 3B:
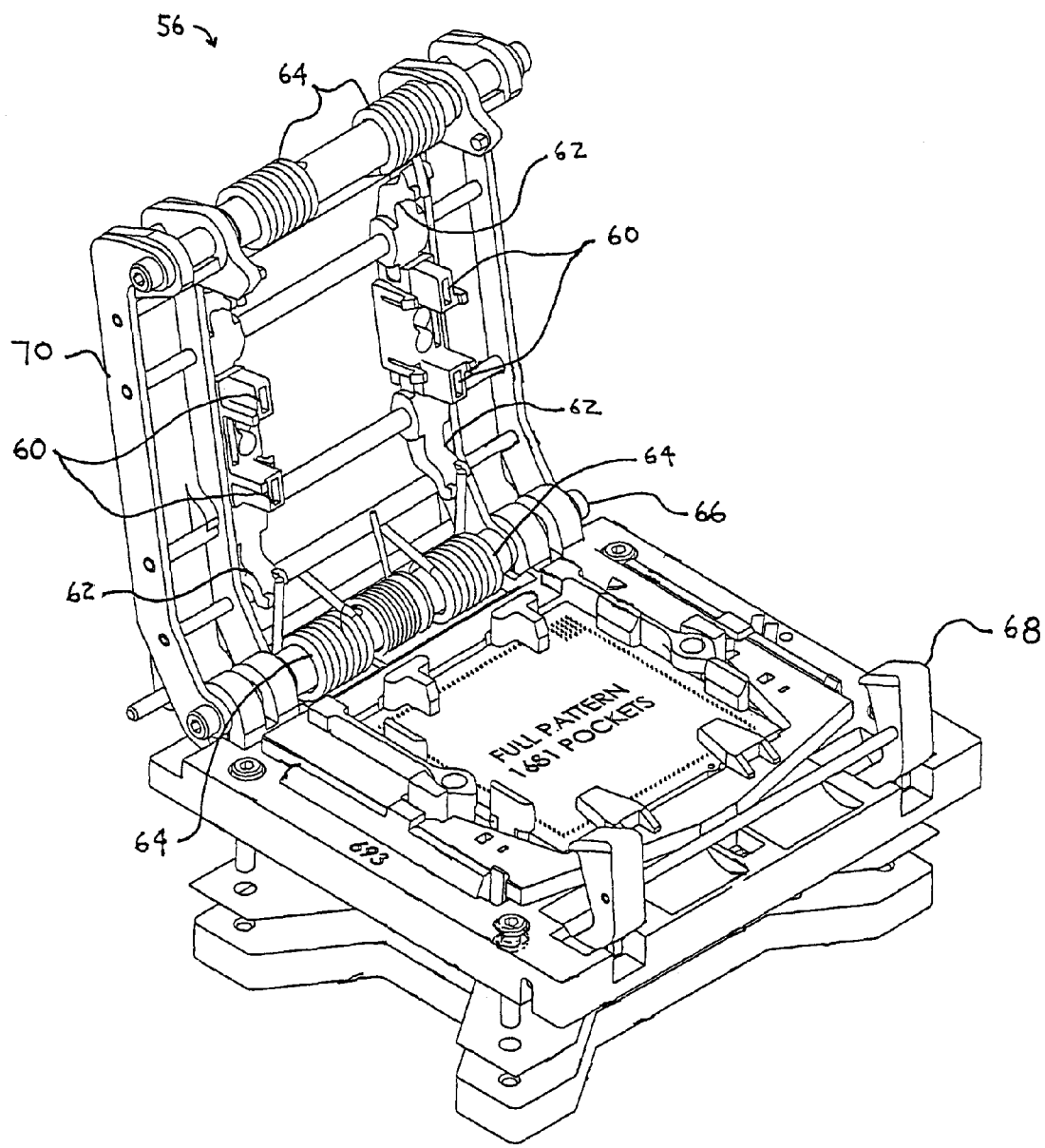
FIG. 3B is a perspective view of the prior art IC socket testing device of FIG. 3A shown in an open position.
Figure 4:
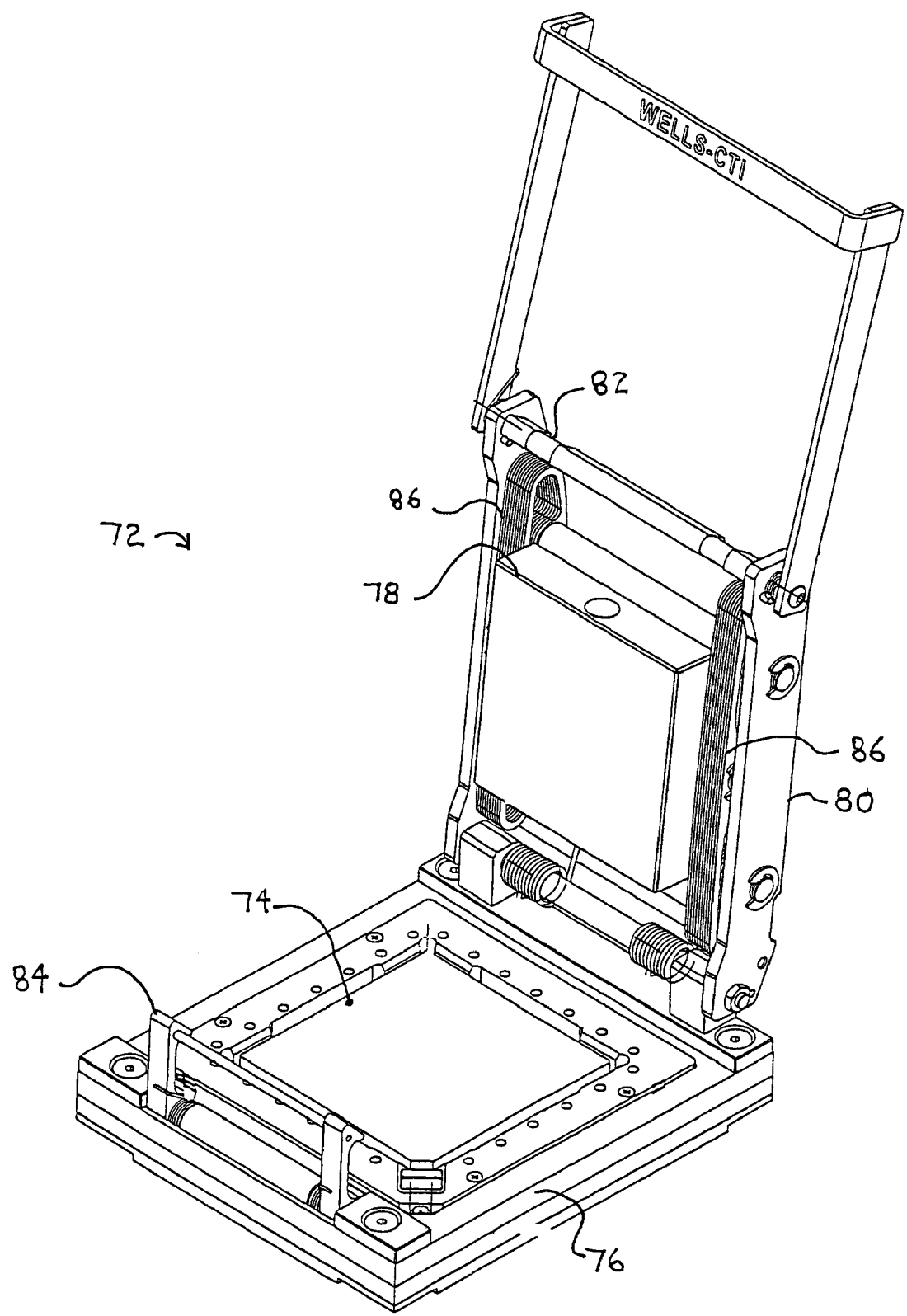
FIG. 4 is a perspective view of an IC socket testing device according to the invention show in an open position.
Figure 5:
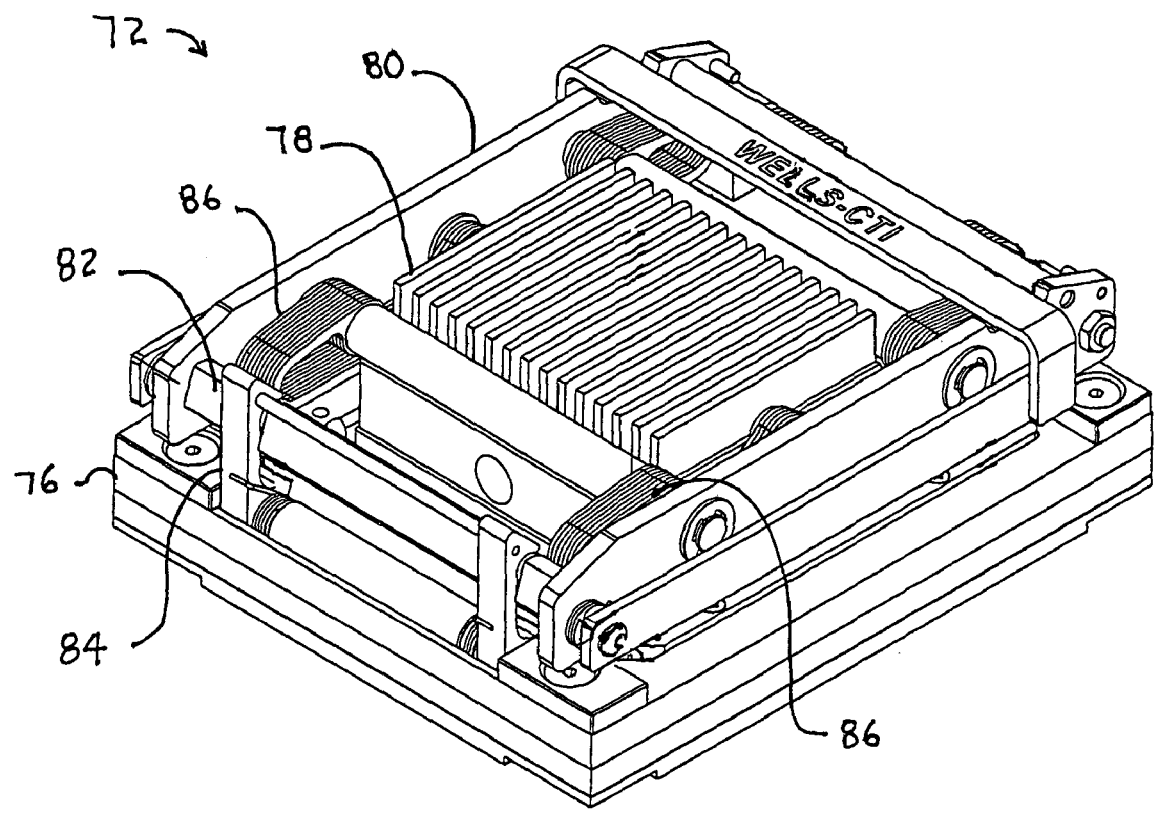
FIG. 5 is a perspective view of the IC socket testing device of FIG. 4 shown in a closed and latched position.

FIGS. 4 and 5 show an IC package testing device 72 according the invention in an open position. An IC package receiver 74 is contained within the base 76 of device 72 for receiving an IC package 88 (See FIGS. 7A–7C and 8A–8C) for testing such as burn-in testing. The pressure pad 78 is positioned within the lid assembly 80. When the device 72 is in a closed position, as shown in FIG. 5, the latch cam 82, positioned on lid 80, is engaged by the latch 84. A normal force is applied to the IC package 88 through the pressure pad 78 by the leaf springs 86. Referring to FIGS. 4 and 5, twenty leaf springs 86 are shown, with ten leaf springs stacked side-by-side on either side of the pressure pad 78 for a total of 20 leaf springs. It is preferable that at least two leaf springs 86 are used with at least one leaf spring positioned on either side of the pressure pad 78 to create a symmetrically balanced normal force in the pressure pad 78. A single such leaf spring 86 is shown in FIG. 9 and further described below.

Figure 6:
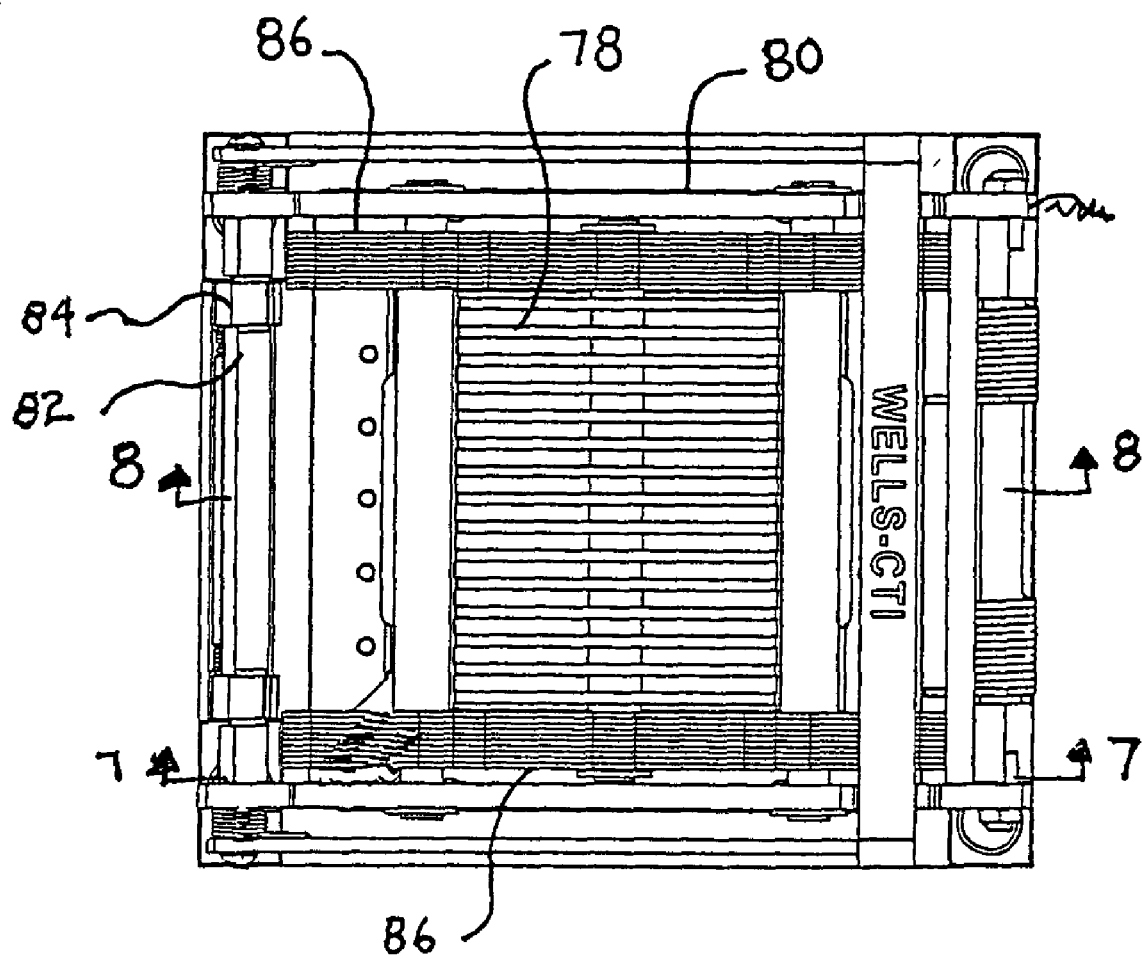
FIG. 6 is a top plan view of the IC testing device of FIG. 4 shown in a closed and latched position.

FIG. 6 shows a top view of the IC package testing device according to the invention in a closed and latched position. The pressure pad 78 is positioned to overlie an IC package. Multiple leaf springs 86 are stacked in equal number on either side of the pressure pad 78 with the lid 80 and pressure pad 78 sized to accommodate multiple leaf springs 86. The leaf springs 86 are laterally thin such that from one to a dozen or more can be stacked side-by-side on both sides of the pressure pad 78 between the pressure pad 78 and the lid 80.

Figure 7A:
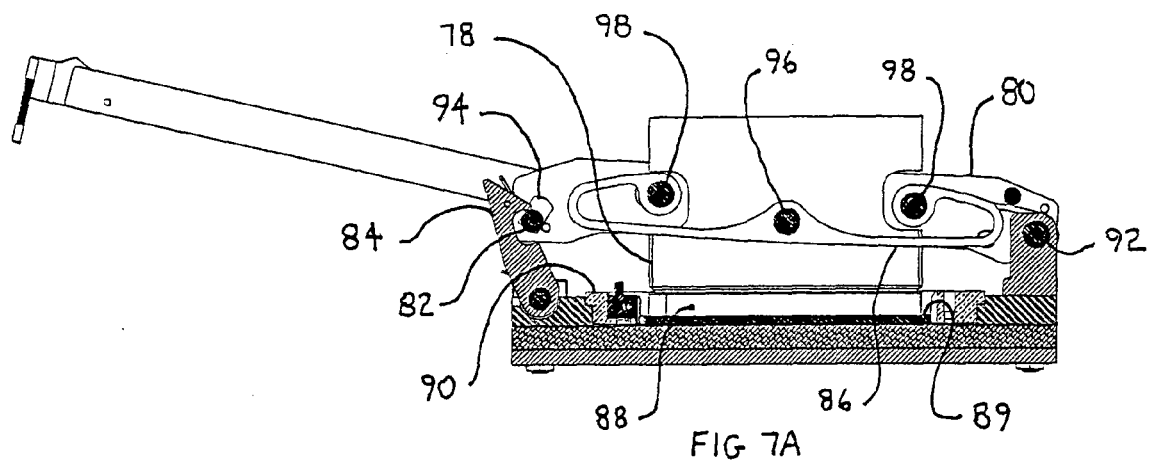
FIG. 7A is a cross-sectional view of the IC testing device of FIG. 4 taken along line 7—7 of FIG. 6 showing compliance springs with the device in a partially closed position.

FIG. 7A shows a cross-sectional view of the IC package testing device according to the invention taken at line 7—7 in FIG. 6. The pressure pad 78 is positioned to overlie an IC package 88 that is received in a recess 89 sized and shaped to receive an IC package 88 that is located on an IC package receiver 90. The lid 80 is attached to the base 76 by a hinge 92. A closure mechanism 94 is positioned opposite the hinge 92. The closure mechanism preferably comprises a latch 84 positioned on the base 76 and a latch cam 82 positioned on the lid 80 to receive and engage the latch 84.

A leaf spring 86 is coupled by a center pivot pin 96 to the pressure pad 78. The leaf spring 86 is also pivotably coupled to the lid 80 at two distal pins 98. FIG. 7A shows the pressure pad 78 rocking about the center pivot pin 96 to lie flat upon the IC package 88 when the lid 80 is in a partially closed position.

Figure 7B:
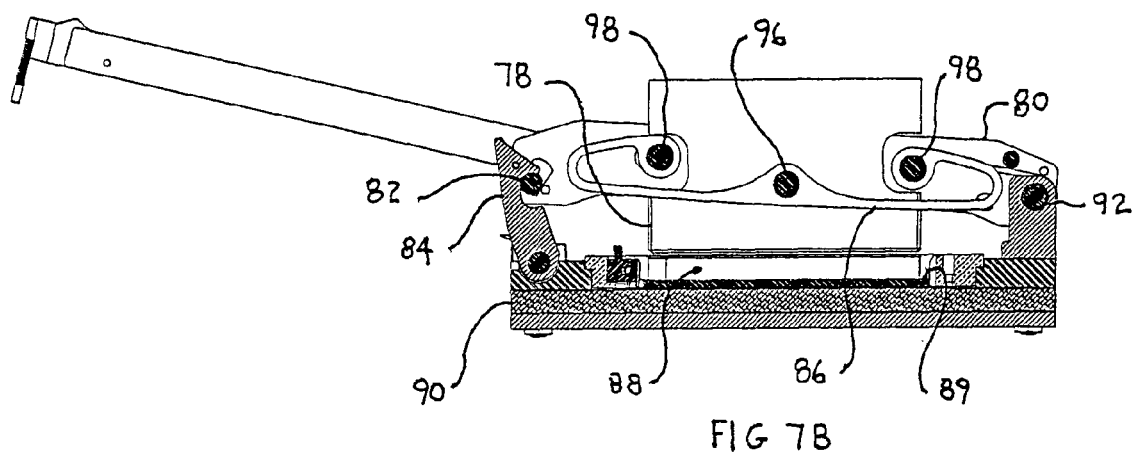
FIG. 7B is a cross-sectional view of the IC testing device of FIG. 4 taken along line 7—7 of FIG. 6 showing compliance springs with the device in a closed but unlatched position.
Figure 7C:
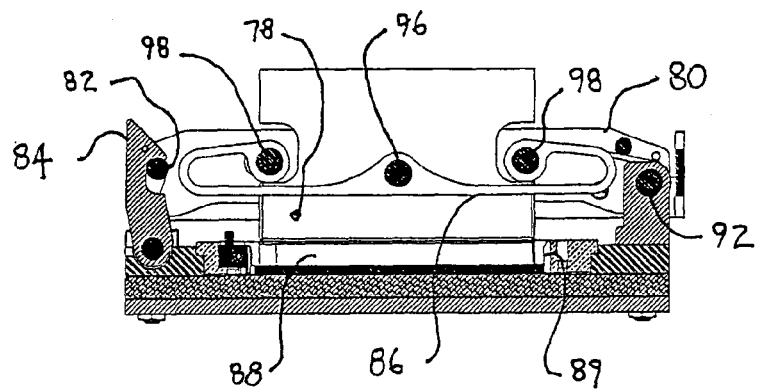
FIG. 7C is a cross-sectional view of the IC testing device of FIG. 4 taken along line 7—7 of FIG. 6 showing compliance springs with the device in a closed and latched position.

FIG. 7B shows the lid 80 in a partially closed position with the latch cam 82 preliminarily engaging the latch 84. FIG. 7C shows the lid 80 in a fully closed position with the latch cam 82 rotated over to fully engage the latch 84. In the fully closed and latched position, the lid 80 forces the leaf spring 86 through the two distal pins 98 to press the pressure pad 78 onto the IC package 88 through the symmetrically located center pivot pin 96. Because the pressure pad 78 is pressed down onto the IC package 88 by the center pivot pin 96 and the symmetrically shaped leaf spring 86, the normal force is equally distributed across the whole IC package 88 ensuring a reliable connection in repeated uses of the IC packaged testing device 72.

The leaf spring 86 shown in FIGS. 7A–7C is preferably formed such that its effective beam length is longer than the linear distance between the two distal pins 98. This may be achieved, as shown in FIG. 9, by shaping the leaf spring 86 with a center pivot attachment hole 100 and spring material extending symmetrically to distal end portions 102. Both distal end portions 102 terminate with fixed attachment holes 104A and 104B that are spaced equidistant from the center pivot attachment hole 100. Both distal end portions 102 curve proximally back toward the center pivot attachment hole 100 such that the curvilinear length along the leaf spring from fixed attachment hole 104A to fixed attachment hole 104B is greater than the linear distance between the fixed attachment holes 104A and 104B.

For certain IC packages, the preferred compliance qualities of the leaf spring 86 are achieved by materials with a modulus of elasticity within a range of $18 \times 10^6$ psi to $22 \times 10^6$ psi. The same Beryllium-Copper alloy that can be used in the manufacture of the IC packages 88, has a modulus of elasticity within the above stated range making a preferred leaf spring material for certain IC packages. A corrosion-resistant plating, such as Nickel plating, may be added to the leaf spring.

For other IC packages, the preferred compliance qualities of the leaf spring 86 are achieved by materials with a modulus of elasticity within a range of $27 \times 10^6$ psi to $30 \times 10^6$ psi. Commonly available stainless steel has a modulus of elasticity within this range and can withstand higher temperatures than the Nickel-plated Beryllium-Copper alloy. Thus, the stainless steel leaf springs can be used for IC packages that require higher burn-in test temperatures than the Nickel-plated Beryllium-Copper can withstand.

The proper amount of spring deflection and force is needed to allow for the variance in IC package thickness due to thickness tolerances. For example, a pair of leaf springs 86 can provide a normal force of 10 pounds on the IC package 88 through the pressure pad when the leaf springs are deflected 0.05 inches. This amount of deflection takes into account the overall thickness tolerance of the IC package as well as any tolerances within the individual components of the IC package testing device 72.

Figure 10A:
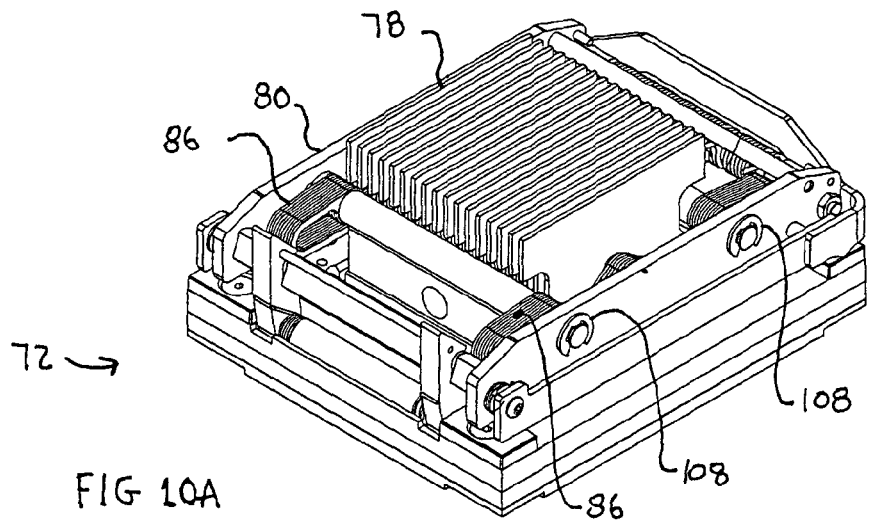
FIG. 10A is a perspective view of the IC testing device of FIG. 4 using 20 leaf springs.

FIG. 10A is a perspective view of the IC package testing device 72 according to the invention, shown with twenty leaf springs 86 positioned in the device. The leaf springs 86 have a thickness that allows them to be positioned side-by-side within the device. Ten leaf springs 86 are positioned on either side of the pressure pad 78 to supply a balanced force to the pressure pad 78 when the device is closed and latched.

Figure 10B:
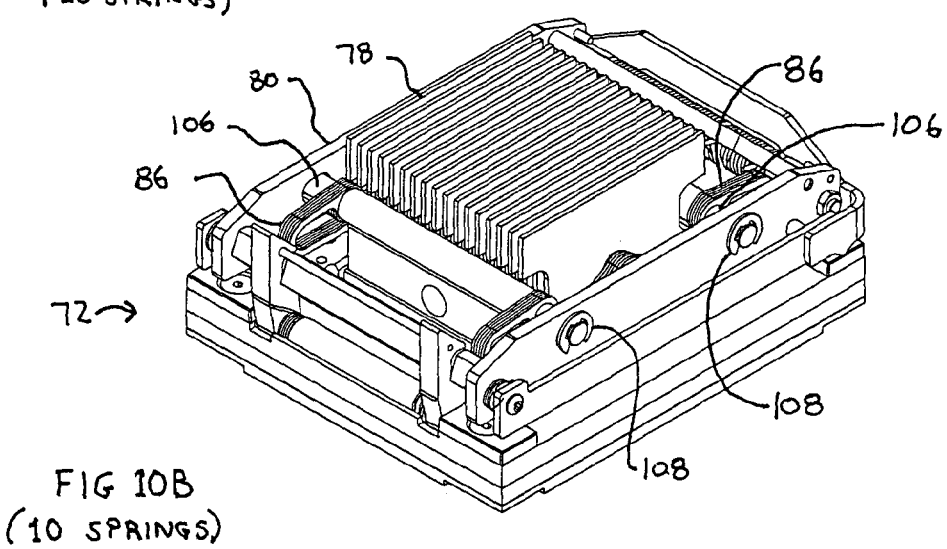
FIG. 10B is a perspective view of the IC testing device of FIG. 4 using 10 leaf springs.

FIG. 10B is a perspective view of the IC package testing device 72 according to the invention, shown with ten leaf springs 86 in the device. The lid 80 and the pressure pad 78 are sized to allow for a variable number of leaf springs 86 to be used in the device 72. Plastic spacers 106 fill the gap on the two distal pins 98 created due to the reduced number of leaf springs 86 in the device.

Figure 10C:
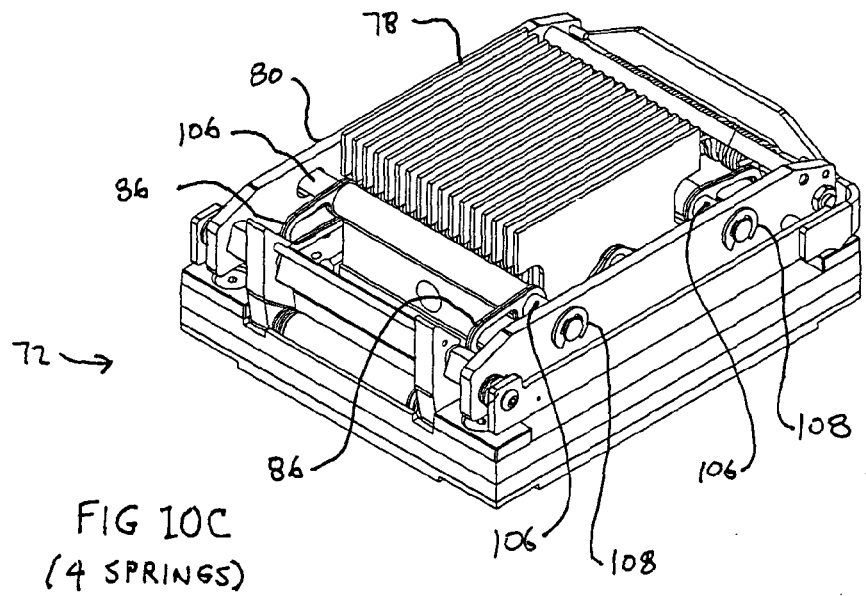
FIG. 10C is a perspective view of the IC testing device of FIG. 4 using 4 leaf springs.

FIG. 10C is a perspective view of the IC package testing device 72 according the invention with four leaf springs 86 in the device. Clips 108 allow for easy disassembly and assembly of the distal pins 98 and the center pivot pin 96 from the lid 80 for changing the number of leaf springs 86.

Figure 8A:
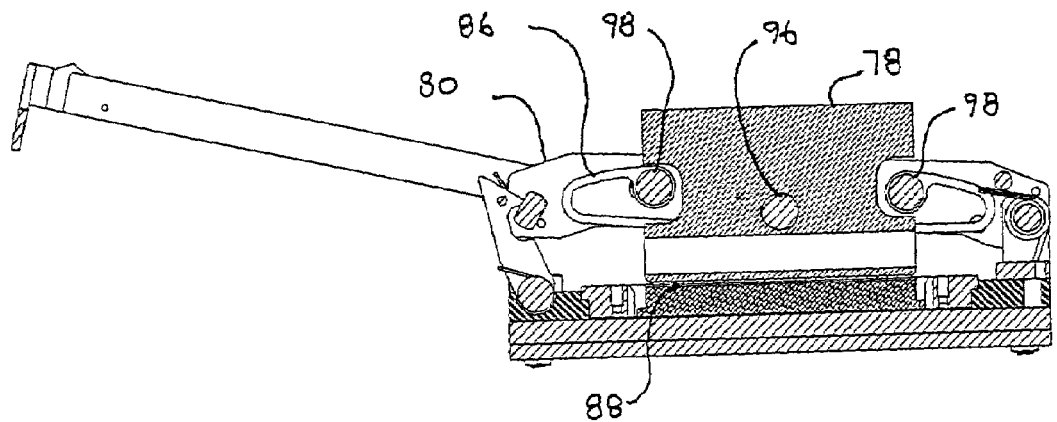
FIG. 8A is a cross-sectional view of the IC testing device of FIG. 4 taken along line 8—8 of FIG. 6 showing the pressure pad with the device in a partially closed position.
Figure 8B:
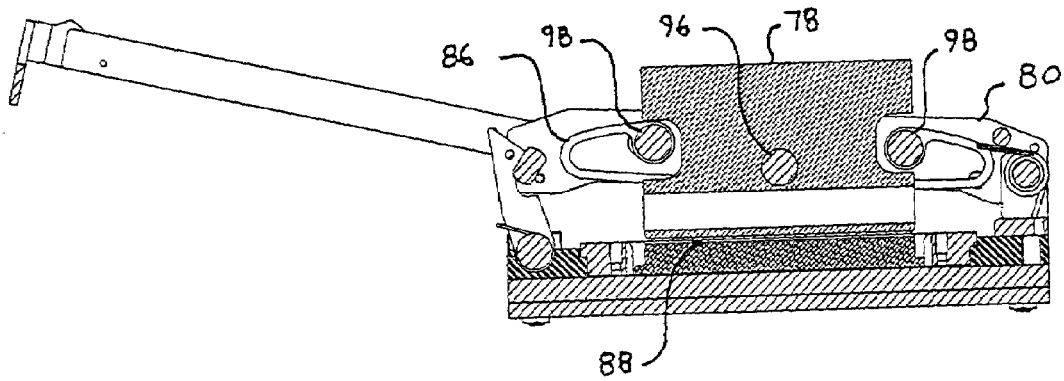
FIG. 8B is a cross-sectional view of the IC testing device of FIG. 4 taken along line 8—8 of FIG. 6 showing the pressure pad with the device in a closed but unlatched position.
Figure 8C:
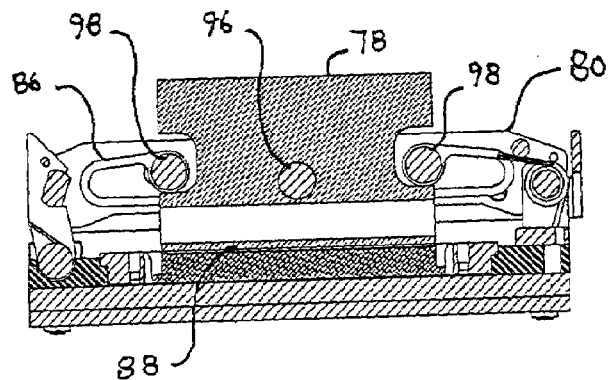
FIG. 8C is a cross-sectional view of the IC testing device of FIG. 4 taken along line 8—8 of FIG. 6 showing the pressure pad with the device in a closed and latched position.
Figure 9:
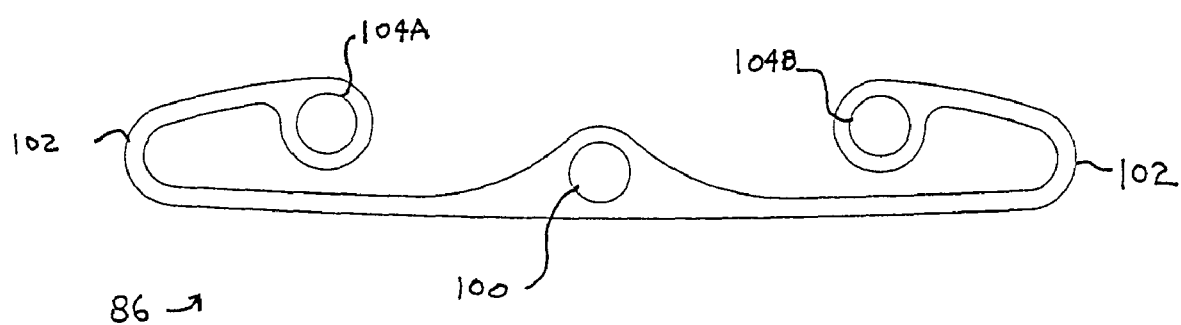
FIG. 9 is a side elevation view of the leaf springs according to an embodiment of the invention.

FIGS. 8A–8C show a cross-sectional view of the IC package testing arrangement taken along line 8—8 in FIG. 6. The IC package 88 has predetermined lateral width and length dimensions and the IC package receiver 74 is sized to receive the IC package 88. The IC package 88 has a predetermined thickness range. The range of thickness is due to the thickness tolerances of the various components of the IC package 88. The number of leaf springs 86 can be selected to apply a resilient normal force to the IC package 88 through the pressure pad 78. The number of leaf springs 86 selected correlates to a variety of factors including the length and width of the IC package 88, the number of leads on the IC package 88 and the geometry of the leads on the IC package 88.

OPERATION OF THE IC PACKAGE TESTING DEVICE

Operation of the IC package testing device according to the invention includes placing an IC package 88 into the IC package receiver 74, clamping the IC package 88 into the receiver by closing the pressure pad 78 down onto the IC package 88 and applying a normal force to the IC package 88 through the pressure pad 78 by closing the latch. The normal force applied to the IC package 88 has variable resilience. This variable resilience is applied with a plurality of leaf springs 86.

The force is varied by varying the number of leaf springs wherein differently sized IC packages 88 are accommodated by changing the number of leaf springs 86. The number of leaf springs is easily changed, first by removing the clips 108 from the two distal pins 98 and the center pivot pin 96 and then by installing or removing the desired number of leaf springs 86.

The leaf springs are engaged by a latch using a latch cam that presses the lid 80 down to apply force through the leaf springs 86 to the pressure pad 78 and normally onto the IC package 88.

Having described and illustrated the principles of the invention in a preferred embodiment thereof, it should be apparent that the invention can be modified in arrangement and detail without departing from such principles. I claim all modifications and variations coming within the spirit and scope of the following claims.

The invention claimed is:

1. An IC package testing device comprising:
   an IC package receiver;
   a pressure pad;
   a lid;
   a latch;
   at least two compliance leaf springs that apply a normal force to an IC package through the pressure pad when the lid is in a latched position;
   a first pivot pin received through coaxially aligned holes in the pressure pad and one or more of said leaf springs, said holes in the pressure pad aligned centrally in the pressure pad and said leaf springs positioned on either side of the pressure pad; and,
   second and third pivot pins aligned parallel to the first pivot pin, and received through coaxially aligned holes in the leaf springs and the lid.

2. The device of claim 1, wherein the pressure pad and lid are sized to provide space between the pressure pad and lid for positioning multiple leaf springs on both sides of the pressure pad.

3. The device of claim 1 wherein the at least two leaf springs are positioned on opposite sides of the pressure pad.

4. The device of claim 1 wherein the at least two leaf springs are positioned side-by-side along one side of the pressure pad.

5. The device of claim 1 wherein multiple leaf springs are positioned side-by-side on opposite sides of the pressure pad.

6. An IC package testing device comprising:
   an IC package receiver including a recess sized and shaped to receive an IC package;
   a lid attached to said receiver by a hinge;
   a pressure pad positioned in the lid so as to overlie the recess;
   a closure mechanism positioned opposite the hinge; and,
   a leaf spring coupled by a center pivot to said pressure pad, said leaf spring being formed in a roughly bow shape extending symmetrically about said center pivot to two distal fixed points, said two distal fixed points pivotably coupled to said lid, wherein said leaf spring applies a normal force to an IC package located in said receiver through the pressure pad when said closure mechanism closes said lid on said IC package receiver,
   said leaf spring further comprising a center pivot attachment hole, spring material extending symmetrically to distal end portions, both end portions terminating in fixed attachment holes spaced equidistantly from the center pivot attachment hole, and both end portions of the material curving proximally toward the center pivot attachment hole, such that a curvilinear length of the leaf spring is greater than a linear distance between the fixed attachment holes.

7. The device of claim 6, said compliance leaf springs further comprising a modulus of elasticity within a range of $18 \times 10^6$ psi to $22 \times 10^6$ psi.

8. The device of claim 6, said compliance leaf springs further comprising a Beryllium Copper alloy.

9. The device of claim 8, said compliance leaf springs further comprising a corrosion resistant plating.

10. The device of claim 6, said compliance leaf springs further comprising a modulus of elasticity within a range of $27 \times 10^6$ psi to $30 \times 10^6$ psi.

11. The device of claim 6, said compliance leaf springs further comprising stainless steel.

12. The device of claim 6, including:
    a first pivot pin received through coaxially aligned holes in the pressure pad and one or more of said leaf springs, said holes in the pressure pad aligned centrally in the pressure pad and said leaf springs positioned on either side of the pressure pad; and
    second and third pivot pins aligned parallel to the first pivot pin, and received through coaxially aligned holes in the leaf springs and the lid.

13. The device of claim 12, wherein the pressure pad and lid are sized to provide space between the pressure pad and lid for positioning multiple leaf springs on both sides of the pressure pad.

14. A method for testing IC packages comprising:
    placing an IC package in an IC package receiver;
    clamping the IC package into the receiver by closing a pressure pad onto the IC package;
    applying a normal farce with variable resilience to the IC package through the pressure pad by closing a latch; and
    applying the variable resilience with a plurality of leaf springs.

15. The method of claim 14, further comprising engaging the leaf springs with a latch using a latch cam.

16. The method of claim 14, wherein differently sized IC packages are accommodated by changing the number of leaf springs.

17. The method of claim 14, further including changing the number of leaf springs to provide a resilient force in correlation to one or more factors including the width and length of the IC package.

18. The method of claim 17, wherein the factors further include one or more of the number of leads on the IC package and the geometry of the leads on the IC package.

19. An IC package testing device comprising:
an IC package receiver;
a pressure pad;
a lid;
a latch; and,
at least two compliance leaf springs that apply a normal force to an IC package through the pressure pad when the lid is in a latched position,
wherein the at least two compliance leaf springs are positioned on opposite sides of the pressure pad.

20. The device of claim 19, wherein the at least two leaf springs further include at least two springs positioned side-by-side along one side of the pressure pad.

21. The device of claim 19, wherein the at least two leaf springs further include multiple leaf springs positioned side-by-side on opposite sides of the pressure pad.

22. An IC package testing device comprising:
an IC package receiver including a recess sized and shaped to receive an IC package;
a lid attached to said receiver by a hinge;
a pressure pad positioned in the lid so as to overlie the recess;
a closure mechanism positioned opposite the hinge;
a leaf spring coupled by a center pivot to said pressure pad, said leaf spring being formed in a roughly bow shape extending symmetrically about said center pivot to two distal fixed points, said two distal fixed points pivotably coupled to said lid, wherein said leaf spring applies a normal force to an IC package located in said receiver through the pressure pad when said closure mechanism closes said lid on said IC package receiver;
a first pivot pin received through coaxially aligned holes in the pressure pad and one or more of said leaf springs, said holes in the pressure pad aligned centrally in the pressure pad and said leaf springs positioned on either side of the pressure pad; and,
second and third pivot pins aligned parallel to the first pivot pin, and received through coaxially aligned holes in the leaf springs and the lid.

23. The device of claim 22, wherein the pressure pad and lid are sized to provide space between the pressure pad and lid for positioning multiple leaf springs on both sides of the pressure pad.

24. The device of claim 23, wherein at least two leaf springs are positioned on opposite sides of the pressure pad.

25. The device of claim 23, wherein at least two leaf springs are positioned side-by-side along one side of the pressure pad.

26. The device of claim 23, wherein multiple leaf springs are positioned side-by-side on opposite sides of the pressure pad.

* * * * *

UNITED STATES PATENT AND TRADEMARK OFFICE
CERTIFICATE OF CORRECTION

PATENT NO. : 7,030,638 B2
APPLICATION NO. : 10/627953
DATED : April 18, 2006
INVENTOR(S) : Jay Stutzman It is certified that error appears in the above-identified patent and that said Letters Patent is hereby corrected as shown below:

Column 5, line 57, change "boles" to --holes--

Column 6, line 58, change "farce" to --force--.

Signed and Sealed this

Eighth Day of August, 2006

JON W. DUDAS
*Director of the United States Patent and Trademark Office*